(12) United States Patent
He et al.

(10) Patent No.: US 10,797,187 B2
(45) Date of Patent: Oct. 6, 2020

(54) PHOTOVOLTAIC DEVICE WITH BACK SIDE CONTACTS

(71) Applicant: Alta Devices, Inc., Sunnyvale, CA (US)

(72) Inventors: Gang He, Cupertino, CA (US); Isik C. Kizilyalli, San Francisco, CA (US); Melissa J. Archer, San Jose, CA (US); Harry A. Atwater, South Pasadena, CA (US); Thomas J. Gmitter, Sunnyvale, CA (US); Andreas G. Hegedus, Burlingame, CA (US); Gregg S. Higashi, San Jose, CA (US)

(73) Assignee: ALTA DEVICES, INC., Sunnyvale, CA (US)

(*) Notice: Subject to any disclaimer, the term of this patent is extended or adjusted under 35 U.S.C. 154(b) by 363 days.

(21) Appl. No.: 14/706,704

(22) Filed: May 7, 2015

(65) Prior Publication Data
US 2015/0243815 A1 Aug. 27, 2015

Related U.S. Application Data

(63) Continuation of application No. 12/605,151, filed on Oct. 23, 2009, now Pat. No. 9,029,687.
(Continued)

(51) Int. Cl.
H01L 31/0224 (2006.01)
H01L 31/0304 (2006.01)
(Continued)

(52) U.S. Cl.
CPC ........... H01L 31/022458 (2013.01); H01L 31/02167 (2013.01); H01L 31/022441 (2013.01);
(Continued)

(58) Field of Classification Search
CPC ..... H01L 31/022441; H01L 31/022458; H01L 31/0304; H01L 31/03046; H01L 31/0735
(Continued)

(56) References Cited

U.S. PATENT DOCUMENTS 4,002,031 A * 1/1977 Bell ..................... F03G 6/001
126/698
4,062,698 A * 12/1977 Blakeslee ............ H01L 31/042
136/246
(Continued)

FOREIGN PATENT DOCUMENTS

JP 63211775 A * 9/1988 ..... H01L 31/022425
JP 04003471 A * 1/1992

OTHER PUBLICATIONS

Machine Translation of JP-04003471-A abstract, pub. Jan. 1992. (Year: 1992).*
Translation of JP-63211775-A. (Year: 1988).*

Primary Examiner — Matthew T Martin
(74) Attorney, Agent, or Firm — Arent Fox, LLP

(57) ABSTRACT

Methods and apparatus for converting electromagnetic radiation, such as solar energy, into electric energy with increased efficiency when compared to conventional solar cells are provided. A photovoltaic (PV) device generally includes a window layer; an absorber layer disposed below the window layer such that electrons are generated when photons travel through the window layer and are absorbed by the absorber layer; and a plurality of contacts for external connection coupled to the absorber layer, such that all of the contacts for external connection are disposed below the absorber layer and do not block any of the photons from reaching the absorber layer through the window layer. Locating all the contacts on the back side of the PV device avoids solar shadows caused by front side contacts, typically found in conventional solar cells. Therefore, PV devices
(Continued)

described herein with back side contacts may allow for increased efficiency when compared to conventional solar cells.

20 Claims, 4 Drawing Sheets

Related U.S. Application Data

(60) Provisional application No. 61/107,966, filed on Oct. 23, 2008.

(51) Int. Cl.
*H01L 31/0352* (2006.01)
*H01L 31/0735* (2012.01)
*H01L 31/18* (2006.01)
*H01L 31/0216* (2014.01)

(52) U.S. Cl.
CPC .... *H01L 31/0304* (2013.01); *H01L 31/03046* (2013.01); *H01L 31/035281* (2013.01); *H01L 31/0735* (2013.01); *H01L 31/184* (2013.01); *H01L 31/1844* (2013.01); *H01L 31/1852* (2013.01); *H01L 31/1892* (2013.01); *H01L 31/022425* (2013.01); *Y02E 10/544* (2013.01); *Y02P 70/521* (2015.11)

(58) Field of Classification Search
USPC .......................................................... 136/255
See application file for complete search history.

(56) References Cited

U.S. PATENT DOCUMENTS 6,084,175 A * 7/2000 Perry .............. H01L 31/022425
  136/256
6,252,287 B1 * 6/2001 Kurtz .................. H01L 31/0725
  136/252
2007/0256728 A1 * 11/2007 Cousins .............. H01L 31/0745
  136/252

* cited by examiner

PHOTOVOLTAIC DEVICE WITH BACK SIDE CONTACTS

CROSS-REFERENCE TO RELATED APPLICATIONS

This application is a continuation application of U.S. patent application Ser. No. 12/605,151 filed Oct. 23, 2009 which claims benefit of U.S. Provisional Patent Application Ser. No. 61/107,966 filed Oct. 23, 2008, which is herein incorporated by reference in its entirety.

BACKGROUND

Technical Field

Embodiments of the present invention generally relate to photovoltaic (PV) devices, such as solar cells, with increased efficiency and greater flexibility and methods for fabricating the same.

Description of the Related Art

As fossil fuels are being depleted at ever-increasing rates, the need for alternative energy sources is becoming more and more apparent. Energy derived from wind, from the sun, and from flowing water offer renewable, environment-friendly alternatives to fossil fuels, such as coal, oil, and natural gas. Being readily available almost anywhere on Earth, solar energy may someday be a viable alternative.

To harness energy from the sun, the junction of a solar cell absorbs photons to produce electron-hole pairs, which are separated by the internal electric field of the junction to generate a voltage, thereby converting light energy to electric energy. The generated voltage can be increased by connecting solar cells in series, and the current may be increased by connecting solar cells in parallel. Solar cells may be grouped together on solar panels. An inverter may be coupled to several solar panels to convert DC power to AC power.

Nevertheless, the currently high cost of producing solar cells relative to the low efficiency levels of contemporary devices is preventing solar cells from becoming a mainstream energy source and limiting the applications to which solar cells may be suited. Accordingly, there is a need for more efficient photovoltaic devices suitable for a myriad of applications.

SUMMARY OF THE INVENTION

Embodiments of the present invention generally relate to methods and apparatus for converting electromagnetic radiation, such as solar energy, into electric energy with increased efficiency when compared to conventional solar cells.

One embodiment of the present invention provides a photovoltaic (PV) device. The PV device generally includes a window layer, an absorber layer disposed below the window layer such that electrons are generated when photons travel through the window layer and are absorbed by the absorber layer, and a plurality of contacts for external connection coupled to the absorber layer, such that the contacts for external connection are disposed below the absorber layer and do not block the photons from reaching the absorber layer through the window layer.

Another embodiment of the present invention is a method of fabricating a PV device. The method generally includes forming a window layer above a substrate, forming an absorber layer above the window layer such that electrons are generated when photons travel through the window layer and are absorbed by the absorber layer, and forming a plurality of contacts for external connection coupled to the absorber layer, such that the contacts for external connection are disposed above the absorber layer and do not block the photons from reaching the absorber layer through the window layer.

BRIEF DESCRIPTION OF THE DRAWINGS

So that the manner in which the above-recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide techniques and apparatus for converting electromagnetic radiation, such as solar energy, into electric energy with increased efficiency when compared to conventional solar cells.

An Exemplary Photovoltaic Unit

Figure 1:
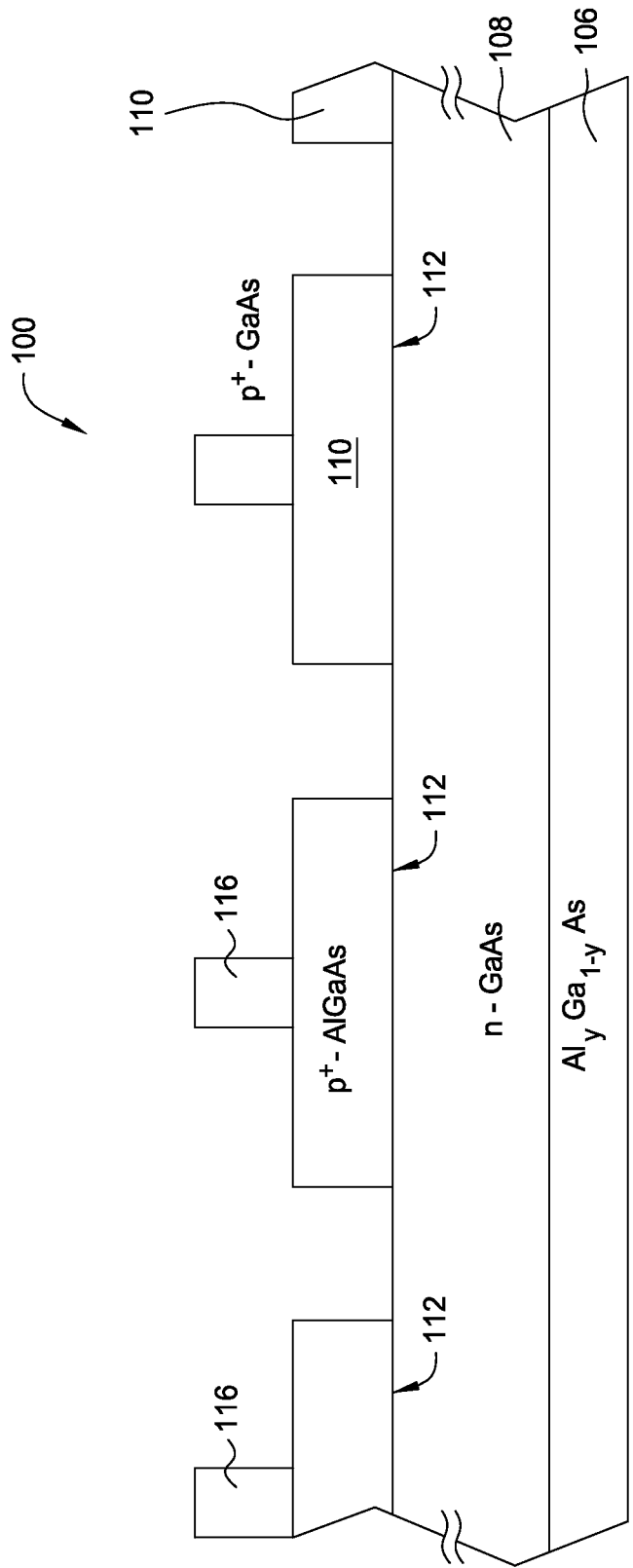
FIG. 1 illustrates multiple epitaxial layers for a photovoltaic (PV) unit in cross-section, in accordance with an embodiment of the present invention.

FIG. 1 illustrates various epitaxial layers of a photovoltaic (PV) unit 100 in cross-section. The various layers may be formed using any suitable method for semiconductor growth, such as molecular beam epitaxy (MBE) or metalorganic chemical vapor deposition (MOCVD), on a substrate (not shown).

The PV unit 100 may comprise a window layer 106 formed above the substrate and any underlying buffer layer(s). The window layer 106 may comprise aluminum gallium arsenide (AlGaAs), such as $Al_{0.3}Ga_{0.7}As$. The window layer 106 may be undoped. The window layer 106 may be transparent to allow photons to pass through the window layer on the front side of the PV unit to other underlying layers.

A base layer 108 may be formed above the window layer 106. The base layer 108 may comprise any suitable group III-V compound semiconductor, such as GaAs. The base layer 108 may be monocrystalline and may be n-doped.

As illustrated in FIG. 1, an emitter layer 110 may be formed above the base layer 108. The emitter layer 110 may comprise any suitable group III-V compound semiconductor for forming a heterojunction with the base layer 108. For example, if the base layer 108 comprises GaAs, the emitter layer 110 may comprise a different semiconductor material, such as AlGaAs (e.g., $Al_{0.3}Ga_{0.7}As$). If the emitter layer 110 and the window layer 106 both comprise AlGaAs, the $Al_xGa_{1-x}As$ composition of the emitter layer 110 may be the same as or different than the $Al_yGa_{1-y}As$ composition of the window layer 106. The emitter layer 110 may be monocrystalline and may be heavily p-doped (i.e., $p^+$-doped). The combination of the base layer 108 and the emitter layer 110 may form an absorber layer for absorbing photons.

The contact of an n-doped base layer to a $p^+$-doped emitter layer creates a p-n layer 112. When light is absorbed near the p-n layer 112 to produce electron-hole pairs, the built-in electric field may force the holes to the $p^+$-doped side and the electrons to the n-doped side. This displacement of free charges results in a voltage difference between the two layers 108, 110 such that electron current may flow when a load is connected across terminals coupled to these layers.

Rather than an n-doped base layer 108 and a $p^+$-doped emitter layer 110 as described above, conventional photovoltaic semiconductor devices typically have a p-doped base layer and an $n^+$-doped emitter layer. The base layer is typically p-doped in conventional devices due to the diffusion length of the carriers.

Once the emitter layer 110 has been formed, cavities or recesses 114 may be formed in the emitter layer deep enough to reach the underlying base layer 108. Such recesses 114 may be formed by applying a mask to the emitter layer 110 using photolithography, for example, and removing the semiconductor material in the emitter layer 110 not covered by the mask using any suitable technique, such as wet or dry etching. In this manner, the base layer 108 may be accessed via the back side of the PV unit 100.

For some embodiments, an interface layer 116 may be formed above the emitter layer 110. The interface layer 116 may comprise any suitable group III-V compound semiconductor, such as GaAs. The interface layer 116 may be $p^+$-doped.

Once the epitaxial layers have been formed, the functional layers of the PV unit 100 (e.g., the window layer 106, the base layer 108, and the emitter layer 110) may be separated from the buffer layer(s) 102 and substrate during an epitaxial lift-off (ELO) process.

Exemplary Electrical Contacts

Electrical contacts may be used to couple the semiconductor layers of the PV unit 100 to wires for connection to other PV units and for external connection to a load. A conventional solar cell typically has contacts on both the front and back sides of the cell. Front side contacts, especially thicker ones, create shadows where light cannot reach the underlying absorber layer to be converted into electric energy. Therefore, the efficiency potential of the solar cell cannot be obtained. Accordingly, techniques and apparatus for contacting the semiconductor layers of the PV unit without introducing shadows are needed.

Figure 2:
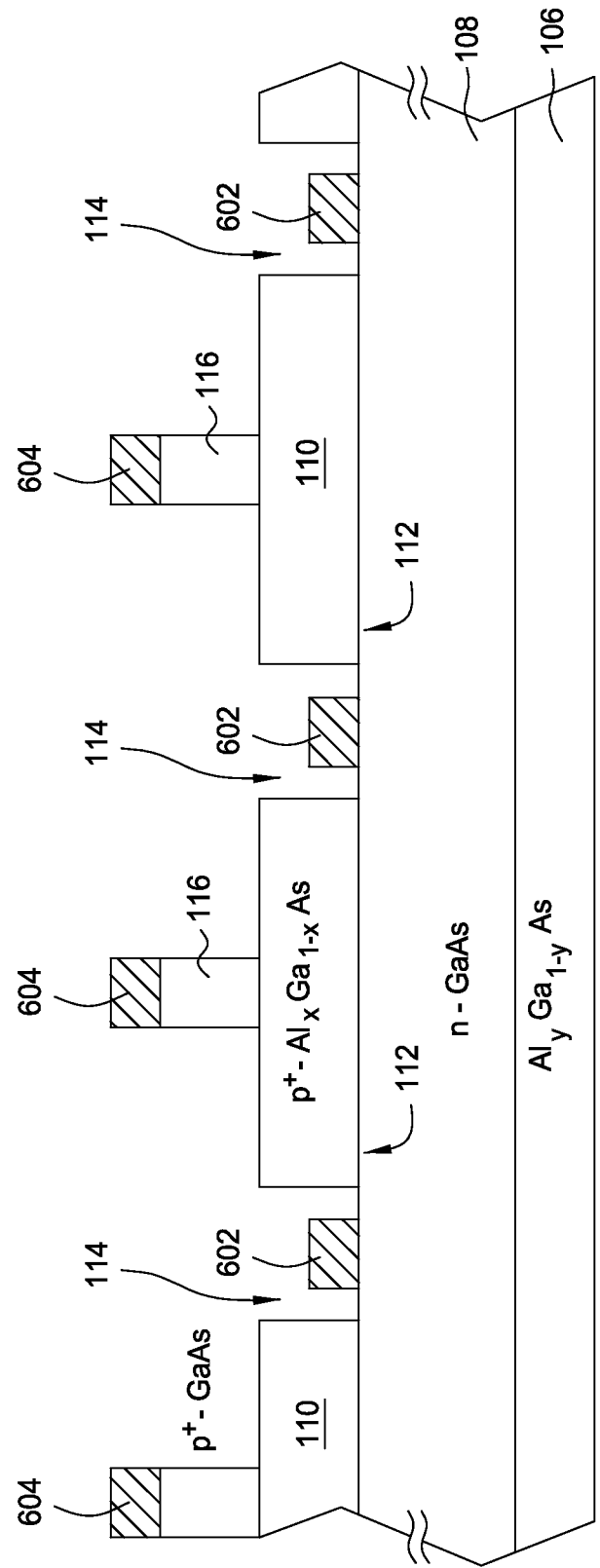
FIG. 2 illustrates contacts to the semiconductor layers being on the back side of the PV unit, in accordance with an embodiment of the present invention.

FIG. 2 illustrates all electrical contacts to the semiconductor layers being on the back side of the PV unit 100, according to an embodiment of the present invention. For example, n-contacts 602 may be formed in the recesses 114 to provide an interface to the n-doped base layer 108, and p-contacts 604 may be formed above the interface layer 116 to couple to the $p^+$-doped emitter layer 110. The heavy doping in the $p^+$-doped interface layer 116 may facilitate making an ohmic contact. In this manner, efficiency need not be sacrificed by having electrical contacts on the front side of the PV unit to block light and create solar shadows.

The pattern of the recesses 114 in the emitter layer 110 and the remaining portion of the interface layer 116 for the contacts 602, 604 may be based on the desired sheet resistance. The dimensions (e.g., area) of the contacts 602, 604 may be very small compared to the dimensions (e.g., area) of a single PV unit 100. What is more, the pattern of the contacts 602, 604 may provide a built-in tolerance against local defects and shadowing.

The contacts 602, 604 may comprise any suitable electrically conductive material, such as a metal or a metal alloy. Preferably, the material for the contacts should not punch through the semiconductor layers during fabrication. Traditional contacts comprising gold (Au) often had this spiking problem. Furthermore, the material for the back side contacts may preferably be capable of being applied at relatively low metallization process temperatures, such as between 150 and 200° C. For example, the contact 602, 604 may comprise palladium/germanium (Pd/Ge) to meet these design goals. Palladium does not react with GaAs.

Whatever material is selected, the contacts 602, 604 may be fabricated on the PV unit 100 by any suitable method, such as vacuum-evaporation through a photoresist, photolithography, screen printing, or merely depositing on the exposed portion of the PV units that have been partially covered with wax or another protective material. These methods all involve a system in which the part of the PV unit on which a contact is not desired is protected, while the rest of the PV unit is exposed to the metal. Of these, screen printing may be the most cost effective, helping to decrease the cost of the resulting PV devices.

Despite all the contacts 602, 604 being on the back side of the PV unit 100 to reduce solar shadows, dark current and its stability with time and temperature may still be concerns when designing an efficient PV unit. An exposed p-n layer 112 may be a source of dark current, and larger recesses 114 may be responsible for an increase in dark current. Thus, smaller recesses 114 may be desired. However, there is a tradeoff between reducing the size of the recesses 14 to reduce dark current and the probability of fabricating the n-contacts 602 in the recesses 114 without touching the sidewalls.

Figure 3:
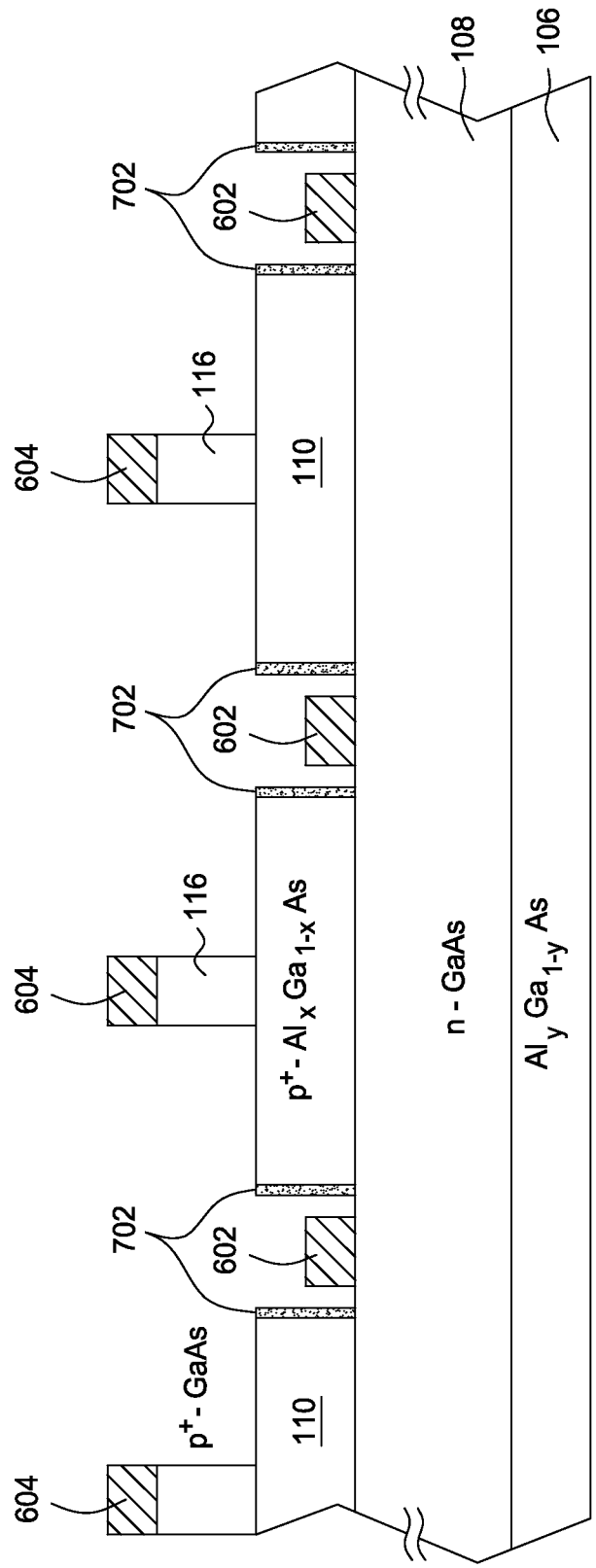
FIG. 3 illustrates passivation on the edges of the recesses in the emitter layer, in accordance with an embodiment of the present invention.

Therefore, for some embodiments, the sidewalls of the recesses 114 may be passivated as another way to reduce the dark current in the PV unit. FIG. 3 illustrates passivation 702 on the sidewalls (i.e., lateral surfaces) of the recesses 114 in the emitter layer 110, in accordance with an embodiment of the present invention. The sidewalls may be passivated most likely before—but possibly after—the n-contacts 602 are formed, using any suitable passivation method, such as chemical vapor deposition (CVD) or plasma-enhanced CVD (PECVD). The passivation 702 may comprise any suitable electrically non-conductive material, such as silicon nitride (SiN), $SiO_x$, $TiO_x$, $TaO_x$, zinc sulfide (ZnS), or any combination thereof.

Figure 4A:
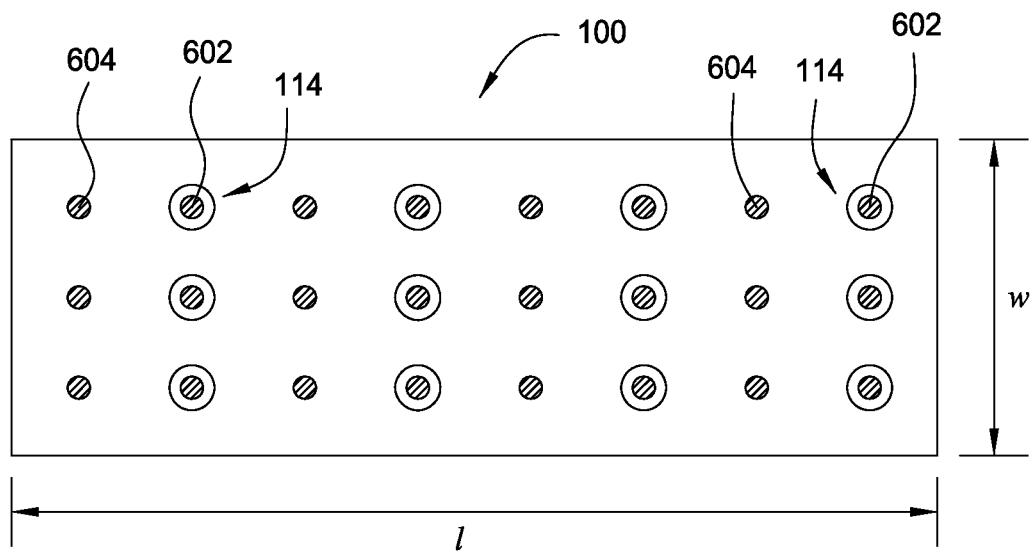
FIG. 4A illustrates the back side of the PV unit, in accordance with an embodiment of the present invention.

FIG. 4A illustrates the back side of the PV unit 100, wherein all the contacts 602, 604 are disposed on the back side. As described above, the n-contacts 602 may be located within the recesses 114 in the emitter layer 110. The PV unit 100 may have a width w of about 2 to 3 cm and a length l of about 10 cm.

Figure 4B:
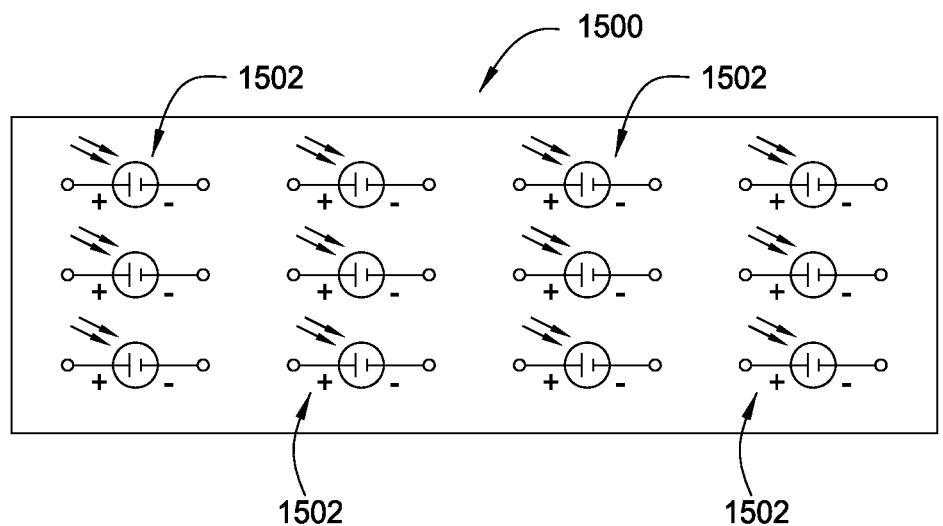
FIG. 4B illustrates an equivalent electrical circuit of the PV unit of FIG. 4A, in accordance with an embodiment of the present invention.

FIG. 4B illustrates an equivalent electrical circuit 1500 of the PV unit 100 of FIG. 4A. One may consider the PV unit 100 as having an efficient miniature solar cell 1502 between each n-contact 602 and p-contact 604. Within a PV unit 100, all of the n-contacts 602 are coupled to the same base layer 108 and all of the p-contacts 604 are coupled to the same emitter layer 110. Therefore, the open circuit voltage ($V_{oc}$)

of the equivalent circuit 1500 may be modeled as the sum of the open circuit voltages across the miniature solar cells 1502 in series, and the short circuit current ($I_{sc}$) may be modeled as the sum of the short circuit currents across the miniature solar cells 1502 in parallel. In essence, the equivalent electrical circuit 1500 of the PV unit 100 may be thought of as a single solar cell with a greater $V_{oc}$ and a larger $I_{sc}$ than those of the miniature solar cells 1502 which compose it.

While the foregoing is directed to embodiments of the invention, other and further embodiments of the invention may be devised without departing from the basic scope thereof, and the scope thereof is determined by the claims that follow.

What is claimed is:

1. A photovoltaic device, comprising:
    a window layer;
    a base layer disposed above the window layer, wherein the base layer is made of a first material including a single group III-V compound semiconductor material having a first doping type;
    an emitter layer disposed above the base layer, wherein the emitter layer is made of a second material including a single group III-V compound semiconductor material different from the first material from which the base layer is made, wherein the second material has a different compound of semiconductors than a compound of semiconductors of the first material such that a heterojunction is formed between the emitter layer and the base layer, wherein the second material has a second doping type that is different than the first doping type of the first material;
    a first contact for external connection disposed above the emitter layer, such that the first contact for external connection is on the back side of the photovoltaic device;
    an interface layer disposed between the first contact and the emitter layer, wherein the interface layer is made of a third material including a single group III-V compound semiconductor material having the second doping type and the same compound of semiconductors as the first material; and
    a second contact for external connection coupled to the base layer disposed entirely within at least one recess formed through the emitter layer and over the base layer, wherein a top surface of the second contact for external connection is at or below a top surface of the emitter layer.

2. The photovoltaic device of claim 1, wherein the single group III-V compound semiconductor material of the second material is monocrystalline.

3. The photovoltaic device of claim 1, wherein the first doping type of the first material from which the base layer is made is n-doped.

4. The photovoltaic device of claim 3, wherein the first material from which the base layer is made comprises n-doped GaAs.

5. The photovoltaic device of claim 1, wherein the second doping type of the second material from which the emitter layer is made is p-doped.

6. The photovoltaic device of claim 5, wherein the second material from which the emitter layer is made comprises p-doped AlGaAs.

7. The photovoltaic device of claim 1, wherein the first contact for external connection coupled to the emitter layer comprises a plurality of first contacts.

8. The photovoltaic device of claim 7, wherein the plurality of first contacts comprise:
    a plurality of p-contacts coupled to the emitter layer.

9. The photovoltaic device of claim 1, wherein the second contact for external connection coupled to the base layer comprises a plurality of second contacts.

10. The photovoltaic device of claim 9, wherein the plurality of second contacts comprise:
    a plurality of n-contacts coupled to the base layer.

11. The photovoltaic device of claim 1, wherein the first contact for external connection coupled to the emitter layer comprises a plurality of contacts and the second contact for external connection coupled to the base layer comprises a plurality of contacts.

12. The photovoltaic device of claim 11, wherein the plurality of first contacts comprise a plurality of p-contacts coupled to the emitter layer; and the plurality of second contacts comprise a plurality of n-contacts coupled to the base layer.

13. The photovoltaic device of claim 1, wherein the first contact and the second contact are on the same side of the device.

14. The photovoltaic device of claim 1, wherein the lateral surfaces of the emitter layer formed by the at least one recess are passivated in order to reduce dark current in the photovoltaic device.

15. The photovoltaic device of claim 14, wherein the lateral surfaces of the emitter layer formed by the at least one recess are passivated with SiN, SiOx, TiOx, TaOx, ZnS, or any combination thereof.

16. The photovoltaic device of claim 1, wherein the first contact comprises Pd/Ge.

17. The photovoltaic device of claim 1, wherein the second contact comprises Pd/Ge.

18. The photovoltaic device of claim 1, wherein the window layer is made of AlGaAs and wherein the second material from which the emitter layer is made comprises p-doped AlGaAs of a different composition than the AlGaAs of the window layer.

19. The photovoltaic device of claim 1, wherein the window layer is made of an undoped single group III-V compound semiconductor material.

20. The photovoltaic device of claim 1, wherein the first doping type of the base layer is n-type and the second doping type of the emitter layer is p-type.

* * * * *